(12) United States Patent
McClintock et al.

(10) Patent No.: US 11,241,839 B2
(45) Date of Patent: Feb. 8, 2022

(54) INTEGRATING 3D PRINTING INTO MULTI-PROCESS FABRICATION SCHEMES

(71) Applicant: Applied Materials, Inc., Santa Clara, CA (US)

(72) Inventors: William H. McClintock, Los Altos, CA (US); Rajeev Bajaj, Fremont, CA (US); Jason G. Fung, Santa Clara, CA (US); Daniel Redfield, Morgan Hill, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 541 days.

(21) Appl. No.: 16/289,213

(22) Filed: Feb. 28, 2019

(65) Prior Publication Data

US 2019/0299537 A1   Oct. 3, 2019

Related U.S. Application Data

(60) Provisional application No. 62/650,452, filed on Mar. 30, 2018.

(51) Int. Cl.
*B29C 64/00* (2017.01)
*B29C 64/393* (2017.01)
(Continued)

(52) U.S. Cl.
CPC ............ *B29C 64/393* (2017.08); *B33Y 50/02* (2014.12); *G01B 9/02049* (2013.01); *G06F 9/3004* (2013.01)

(58) Field of Classification Search
CPC ..................................................... B29C 64/00
(Continued)

(56) References Cited

U.S. PATENT DOCUMENTS 9,425,121 B2   8/2016   Tsai et al.
10,217,637 B1 *  2/2019   Budd .................... H01L 23/544
(Continued)

FOREIGN PATENT DOCUMENTS

CN   105161432 A   12/2015
JP   6263573 B2    1/2018
(Continued)

OTHER PUBLICATIONS

PCT International Search Report and Written Opinion dated Jun. 11, 2019, for International Application No. PCT/US2019/019669.

*Primary Examiner* — Suresh Suryawanshi
(74) *Attorney, Agent, or Firm* — Patterson + Sheridan LLP

(57) ABSTRACT

Embodiments disclosed herein provide methods of forming bond pad redistribution layers (RDLs) in a fan-out wafer level packaging (FOWLP) scheme using an additive manufacturing process. In one embodiment, a method of forming a redistribution layer includes positioning a carrier substrate on a manufacturing support of an additive manufacturing system, the carrier substrate including a plurality of singulated devices, detecting one or more fiducial features corresponding to each of the plurality of singulated devices, determining actual positions of each of the plurality of singulated devices relative to one or more components of the additive manufacturing system, generating printing instructions for forming a patterned dielectric layer based on the actual positions of each of the plurality of singulated devices, and forming the patterned dielectric layer using the printing instructions.

20 Claims, 5 Drawing Sheets

(51) Int. Cl.
*G01B 9/02* (2006.01)
*G06F 9/30* (2018.01)
*B33Y 50/02* (2015.01)

(58) Field of Classification Search
USPC .......................................................... 700/119
See application file for complete search history.

(56) References Cited

U.S. PATENT DOCUMENTS

| | | |
|---|---|---|
| 2002/0058396 A1 | 5/2002 | Roberts et al. |
| 2013/0342233 A1* | 12/2013 | Edwards ............ G01R 1/06733 324/750.25 |
| 2016/0073496 A1 | 3/2016 | Vincent |
| 2016/0107287 A1 | 4/2016 | Bajaj et al. |
| 2016/0107295 A1 | 4/2016 | Bajaj et al. |
| 2016/0114458 A1 | 4/2016 | Bajaj et al. |
| 2016/0136787 A1 | 5/2016 | Bajaj et al. |
| 2016/0247784 A1* | 8/2016 | Wang ...................... H01L 24/94 |
| 2016/0329244 A1 | 11/2016 | Chiao et al. |
| 2017/0072466 A1 | 3/2017 | Zehavi et al. |
| 2017/0100817 A1 | 4/2017 | Ganapathiappan et al. |
| 2017/0125318 A1* | 5/2017 | Harr ................... H01L 29/0657 |
| 2017/0136603 A1 | 5/2017 | Ganapathiappan et al. |
| 2020/0006307 A1* | 1/2020 | Tsai ........................ H01L 24/73 |

FOREIGN PATENT DOCUMENTS

| | | |
|---|---|---|
| WO | 2016004125 A2 | 1/2016 |
| WO | 2016173668 A1 | 11/2016 |
| WO | 2017035007 A1 | 3/2017 |

* cited by examiner

INTEGRATING 3D PRINTING INTO MULTI-PROCESS FABRICATION SCHEMES

CROSS-REFERENCE TO RELATED APPLICATIONS

This application claims priority to U.S. Provisional Application Ser. No. 62/650,452 filed on Mar. 30, 2018, which is herein incorporated by reference in its entirety.

BACKGROUND

Field

Embodiments described herein generally relate to the field of electronic device packaging, and more specifically, to methods of forming bond pad redistribution layers in a fan-out wafer level packaging scheme.

Description of the Related Art

As circuit densities increase and device size decreases for next generation semiconductor devices, providing the external connections, i.e., wiring, to the device requires advanced packaging schemes, such as fan-out wafer level packaging. Fan-out wafer level packaging (FOWLP) schemes enable an increased number of I/O connections to a semiconductor device having an otherwise limiting surface area by redistributing the I/O terminals of the device to areas external of the surface thereof. Typically, the I/O terminals are redistributed using one or more layers of a dielectric material having electrically conductive via and wire interconnect features formed therein, known as bond pad redistribution layers, hereafter bond pad RDL's.

In a chip-first FOWLP scheme, singulated semiconductor devices, are spaced apart in a carrier substrate, such as a reconstituted substrate, before the bond pad RDLs are formed thereon. Conventionally, bond pad RDLs in a chip-first FOWLP scheme are formed by depositing a photosensitive dielectric polymer onto the surface of the reconstituted substrate, using a conventional photolithography and etch process sequence to form a patterned dielectric layer having via and wire interconnect openings formed therein, and depositing a conductive material, such as copper, into the via and wire interconnect openings to form the via and wire interconnects.

Process defects associated with forming the carrier substrate, including improper positioning of the singulated devices on a mold plate or undesirable shifting of the singulated devices during curing of a reconstituted substrate molding compound, can cause the singulated devices to deviate from their intended position.

Unfortunately, deviation of a singulated device from its intended position or other positional variation of a singulated device in the carrier substrate can cause misalignment between the via interconnects in a subsequently formed bond pad RDL and the I/O terminals, e.g., bond pads, of the device. Further, conventional lithography and etch processes are undesirably costly, equipment intensive, and time consuming.

Accordingly, there is a need in the art for improved methods of forming bond pad RDLs in a fan-out wafer level packaging scheme.

SUMMARY

Embodiments disclosed herein provide methods of forming bond pad RDLs in a fan-out wafer level packaging (FOWLP) scheme using an additive manufacturing process. In particular, embodiments herein provide for the formation of one or more patterned dielectric layers, having a plurality of interconnect openings defined therein, using an additive manufacturing system, such as a 3D printing system.

In one embodiment, a method of forming a redistribution layer includes positioning a carrier substrate on a manufacturing support of an additive manufacturing system, the carrier substrate including a plurality of singulated devices, detecting one or more fiducial features corresponding to each of the plurality of singulated devices, determining actual positions of each of the plurality of singulated devices relative to one or more components of the additive manufacturing system, generating printing instructions for forming a patterned dielectric layer based on the actual positions of each of the plurality of singulated devices, and forming the patterned dielectric layer using the printing instructions.

In another embodiment, a method of forming a redistribution layer includes positioning a carrier substrate on a manufacturing support of an additive manufacturing system. Herein, the carrier substrate comprises a plurality of singulated devices embedded in and spaced apart by a molding compound. The method further includes detecting one or more fiducial features corresponding to each of the plurality of singulated devices using one or more image sensors of the additive manufacturing system, determining actual positions of each of the plurality of singulated devices relative to one or more components of the additive manufacturing system, generating printing instructions for forming a patterned dielectric layer based on the actual positions of each of the plurality of singulated devices, and forming the patterned dielectric layer using the printing instructions. Herein, forming the patterned dielectric layer comprises dispensing, using the additive manufacturing system, a plurality of droplets of a dielectric precursor composition about perimeters of a plurality of desired openings in the to be formed patterned dielectric layer and at least partially curing each of the dispensed droplets before it spreads to its equilibrium size.

In another embodiment, a computer readable medium having instructions stored thereon for a method of forming a redistribution layer is provided. The method includes positioning a carrier substrate on a manufacturing support of an additive manufacturing system. Herein the carrier substrate comprises a plurality of singulated devices embedded in and spaced apart by a molding compound. The method further includes detecting one or more fiducial features corresponding to each of the plurality of singulated devices using one or more image sensors of the additive manufacturing system, determining actual positions of each of the plurality of singulated devices relative to one or more components of the additive manufacturing system, generating printing instructions for forming a patterned dielectric layer based on the actual positions of each of the plurality of singulated devices, and forming the patterned dielectric layer using the printing instructions. Herein, forming the patterned dielectric layer comprises dispensing, using the additive manufacturing system, a plurality of droplets of a dielectric precursor composition about perimeters of a plurality of desired openings in the to be formed patterned dielectric layer and at least partially curing each of the dispensed droplets before it spreads to its equilibrium size.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments disclosed herein provide methods of forming bond pad RDLs in a fan-out wafer level packaging (FOWLP) scheme using an additive manufacturing process, such as a 3D printing process. In particular, embodiments herein provide for the formation of one or more patterned dielectric layers, having a plurality of interconnect openings defined therein, using an additive manufacturing system, such as a 3D printing system. Typically, the methods herein include detecting the actual positions, including the orientations, of each of a plurality of singulated devices disposed in a carrier substrate, generating instructions for forming a patterned dielectric layer on the carrier substrate, and forming the patterned dielectric layer on the carrier substrate using the printing instructions. In some embodiments, the methods further include using the additive manufacturing system to form the via and wire interconnects of the bond pad RDL's. As used herein, singulated device includes one singulated independently functional device or a singulated plurality of independently functional devices.

In some embodiments, the position of each of a plurality of singulated devices disposed in the carrier substrate is determined using an image sensor which detects one or more fiducial features (a feature that serves as a reference or alignment point) of each device. The image detected by the image sensor is communicated to a system controller which determines the actual position, including the orientation, of the device relative to one or more components of the additive manufacturing system, such as relative to a movable dispense head used to form the patterned dielectric layer. In some embodiments, the system controller determines the actual position of the device relative to one or more reference locations in the carrier substrate. In some embodiments, the reference location is the intended position of the device on or in the carrier substrate.

Figure 1A:
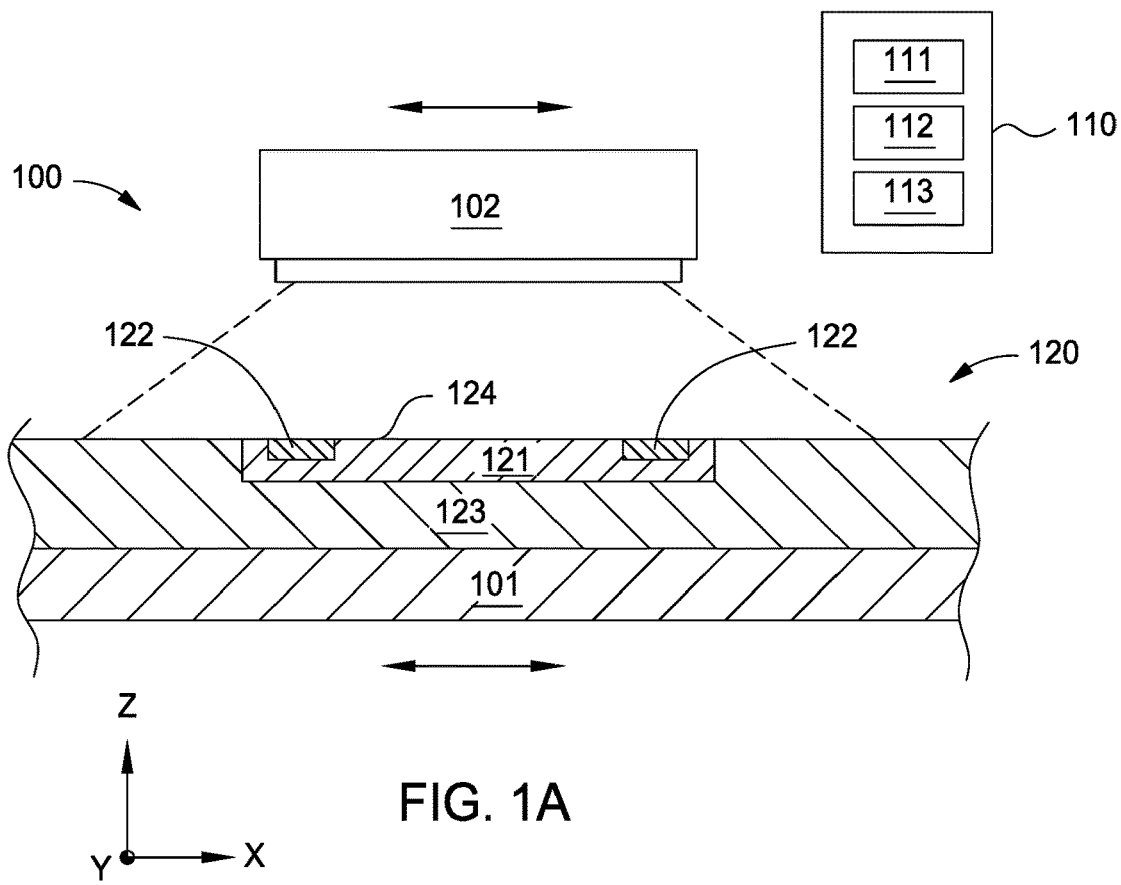
FIGS. 1A-1B are schematic sectional views of an exemplary additive manufacturing system used to practice the methods set forth herein, according to one embodiment. The view in FIG. 1B is orthogonal to the view in FIG. 1A.
Figure 1B:
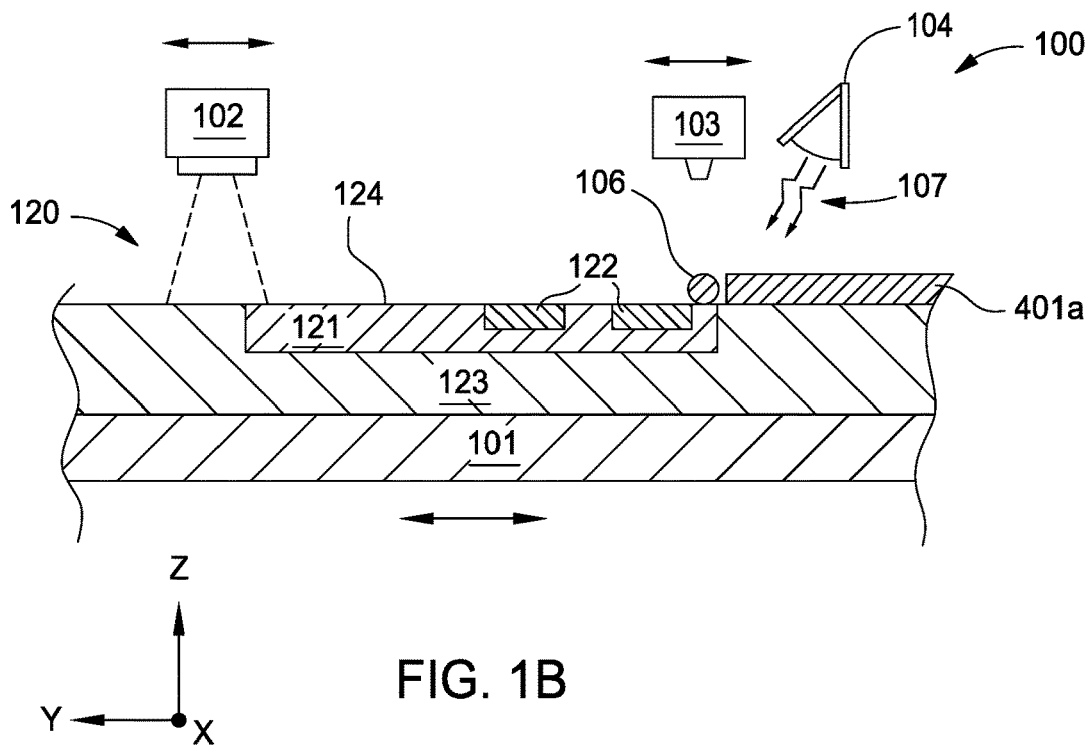

FIGS. 1A-1B are schematic sectional views of an exemplary additive manufacturing system used to practice the methods set forth herein, according to one embodiment. The view in FIG. 1B is orthogonal to the view in FIG. 1A.

The additive manufacturing system 100 includes a movable manufacturing support 101 which supports a carrier substrate 120, one or more movable dispense heads 103 (shown in FIG. 1B) disposed above the manufacturing support 101, an electromagnetic radiation source, such as a UV source 104, disposed above the manufacturing support 101 and positioned to direct electromagnetic radiation 107, theretowards, an image sensor 102 disposed above the manufacturing support 101 and facing theretowards, and a system controller 110. In some embodiments, the UV source 104 is coupled to the dispense head 103 and is movable therewith.

Each of the one or more dispense heads 103 herein includes one or more nozzles 105 for dispensing droplets 106 of a precursor composition. Herein, the manufacturing support 101 moves independently of each of the one more dispense heads 103, and each of the one or more dispense heads 103 move independently of one another. Further herein, each of the one or more nozzles 105 are independently controlled to enable dispensing of droplets 106 at desired locations and of desired size, e.g., volumes, on the carrier substrate 120 or on a previously formed patterned sublayer (not shown).

Herein, the image sensor 102 is used to detect shapes or patterns, such as one or more fiducial features in, on, or of each of the plurality of singulated devices 121 or a plurality of fiducial features in, on, or of a previously formed bond pad RDL (not shown) on the carrier substrate 120 where of the plurality of fiducial features in, on, or of a previously formed bond pad RDL correspond to a respective singulated devices 121. In some embodiments, the image sensor 102 comprises a camera, such as a frame camera or a line scan camera. In other embodiments, the image sensor 102 comprises any suitable sensor used to detect images or to detect interfaces of features in, on, or of each of the plurality of singulated devices 121 that can be used to form a two dimensional or three dimensional image. For example, in some embodiments one or more image sensors comprise a laser scanner or an interferometer. Herein, the image sensor 102 moves independently of the manufacturing support 101, is fixedly coupled a non-moving surface of the additive manufacturing system 100, or is coupled to one of the one or more movable dispense heads 103.

Typically, the image sensor 102 captures image information from each of the plurality of singulated devices 121 and communicates the image information to the system controller 110 communicatively coupled thereto. The system controller 110 uses the image information to determine the actual positions of each of the plurality of singulated devices 121 (including their orientation) in the carrier substrate 120 and, or, relative to one or more components of the additive manufacturing system 100, such as relative to the one or more dispense heads 103. The system controller 110 uses the actual positions of each of the plurality of singulated devices 121 to generate printing instructions to be used by the additive manufacturing system 100 in forming a patterned dielectric layer on the carrier substrate 120 or on a previously formed bond pad RDL (not shown).

Herein, the system controller 110 includes a programmable central processing unit (CPU) 111 that is operable with a memory 112 (e.g., non-volatile memory) and support circuits 113. The support circuits 113 are conventionally coupled to the CPU 111 and comprise cache, clock circuits, input/output subsystems, power supplies, and the like, and combinations thereof coupled to the various components of the additive manufacturing system 100, to facilitate control of an additive manufacturing process. The CPU 111 is one of any form of general purpose computer processor used in an industrial setting, such as a programmable logic controller (PLC), for controlling various additive manufacturing system components and sub-processors. The memory 112, coupled to the CPU 111, is non-transitory and is typically one or more of readily available memories such as random access memory (RAM), read only memory (ROM), floppy disk drive, hard disk, or any other form of digital storage, local or remote.

Typically, the memory 112 is in the form of a computer-readable storage media containing instructions (e.g., non-volatile memory), that when executed by the CPU 111, facilitates the operation of the additive manufacturing system 100. The instructions in the memory 112 are in the form of a program product such as a program that implements the methods of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein).

Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

Herein, the system controller 110 further controls the dispensing and partial curing of droplets of dielectric precursor composition(s) used to form the patterned dielectric layers according to the generated printing instructions.

Figure 1C:
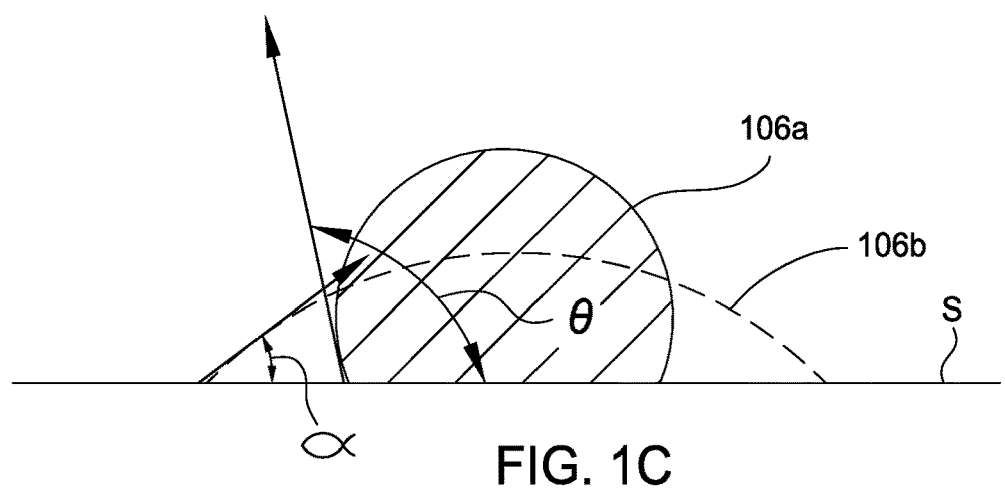
FIG. 1C is a close up sectional view illustrating droplets of a dielectric precursor composition dispensed by an additive manufacturing system, according to one embodiment.

In at least some embodiments herein, interconnect openings in the patterned dielectric layers are defined by dispensing a plurality of droplets about a desired perimeter of a to be formed via or wire interconnect and at least partially curing each of the droplets before it spreads to its equilibrium size, i.e. fixing the contact angle of the droplet on a surface, such as described in FIG. 1C.

FIG. 1C illustrates an exemplary fixed droplet 106a, i.e., a droplet that was at least partially cured before spreading to its equilibrium size, and an exemplary unfixed droplet 106b, i.e., a droplet that was allowed to spread to its equilibrium size. The exemplary droplets 106a,b are disposed on a surface S that is any one or a combination of an active surface of a device, a surface of a carrier substrate, a surface of a previously formed patterned sublayer, or a surface of a previously formed bond pad RDL. The fixed droplet 106a has a contact angle θ with the surface S that is greater than the contact angle α, which is the contact angle of the unfixed droplet 106b with the surface S. In some embodiments, the contact angle θ of the fixed droplet 106a is desirably controlled by exposing a dispensed droplet 106 to electromagnetic radiation from a curing source substantially upon contact of the dispensed droplet with the surface S. Herein, substantially upon contact is within about 1 second or less from the moment a dispensed droplet first comes into contact with the surface S. In some embodiments, the contact angle θ of the fixed droplet 106a is desirably controlled to an angle of greater than about 50°, such as greater than about 55°, greater than about 60°, or greater than about 70°, or even greater than about 80°.

Figure 2A:
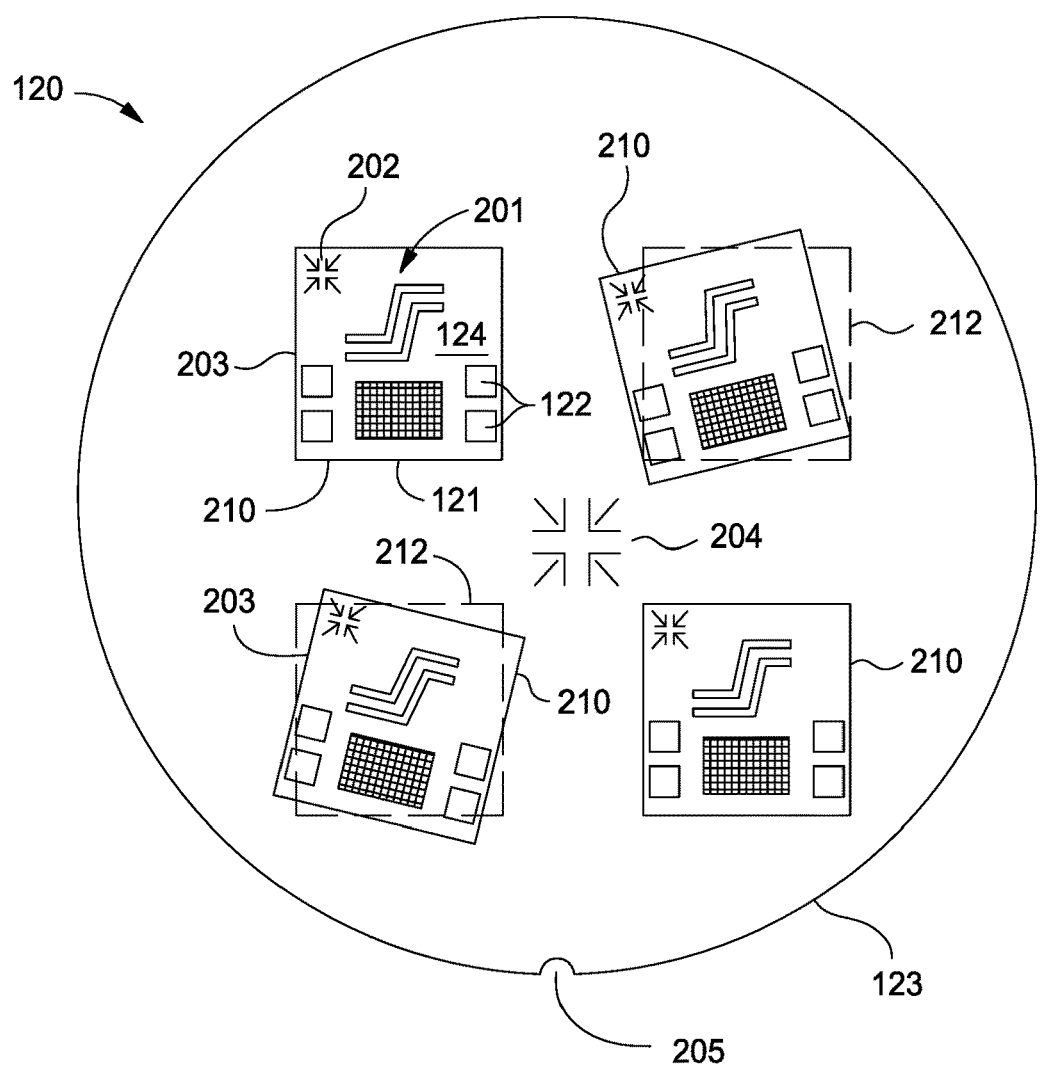
FIG. 2A is a schematic plan view of an exemplary carrier substrate, according to one embodiment.

FIG. 2A is a plan view of a surface of an exemplary carrier substrate, the surface including active surfaces of a plurality of singulated devices according to one embodiment. Herein, the carrier substrate 120 is a reconstituted substrate which includes a plurality of singulated devices 121 embedded in and spaced apart by a cured molding compound 123, such as an epoxy. In some embodiments, the carrier substrate 120 is formed by temporarily securing a plurality of devices 121 to a molding plate (not shown) by an adhesion layer disposed between the molding plate and active surfaces 124 of the plurality of devices, dispensing an epoxy precursor thereover, curing the epoxy to form the reconstituted substrate, and removing the reconstituted substrate from the molding plate to expose a surface thereof, such as the surface of the carrier substrate 120 shown in FIG. 2A. Herein, each of the plurality devices 121 includes an active surface 124 having a plurality of exposed I/O terminals, such as the plurality of bond pads 122. Herein, at least some of the singulated devices 121 have an actual position 210 that is different from an intended position 212 (e.g., expected or desired position) of the singulated device 121. In some embodiments, one or more of the bond pads 122 of a singulated device 121 have a surface area of between about 1 μm² and about 100 μm², or less than about 50 μm², such as less than about 25 μm², for example less than about 5 μm².

Generally, a plurality of features, such as metal features, disposed in one or more transparent dielectric layers form a pattern 201 both in and below the active surface 124 of each device. In some embodiments, each of the singulated devices 121 further includes one or more dedicated alignment marks 202 formed in or below the active surface 124 thereof. The pattern 201, portions of the pattern 201, the one or more dedicated alignment marks 202, edges 203 of a singulated device 121, and combinations thereof, are examples of fiducial features detectable by an image sensor, such as the image sensor 102 of FIGS. 1A-1B. Fiducial features are used by the system controller 110 to determine the actual position 210 of each singulated device 121 in the carrier substrate 120 and, or, relative to the one or more dispense heads 103. In some embodiments, the carrier substrate 120 further includes one or more fiducial features, such as an alignment mark 204 formed in or on the molding compound 123 or a notch 205 formed in an edge thereof, which is detectable by the image sensor 102 and used by a system controller 110 to determine the position, including the orientation, of the carrier substrate 120 to one or more components of an additive manufacturing system, such as to the one or more dispense heads 103 described in FIG. 1B.

Figure 2C:
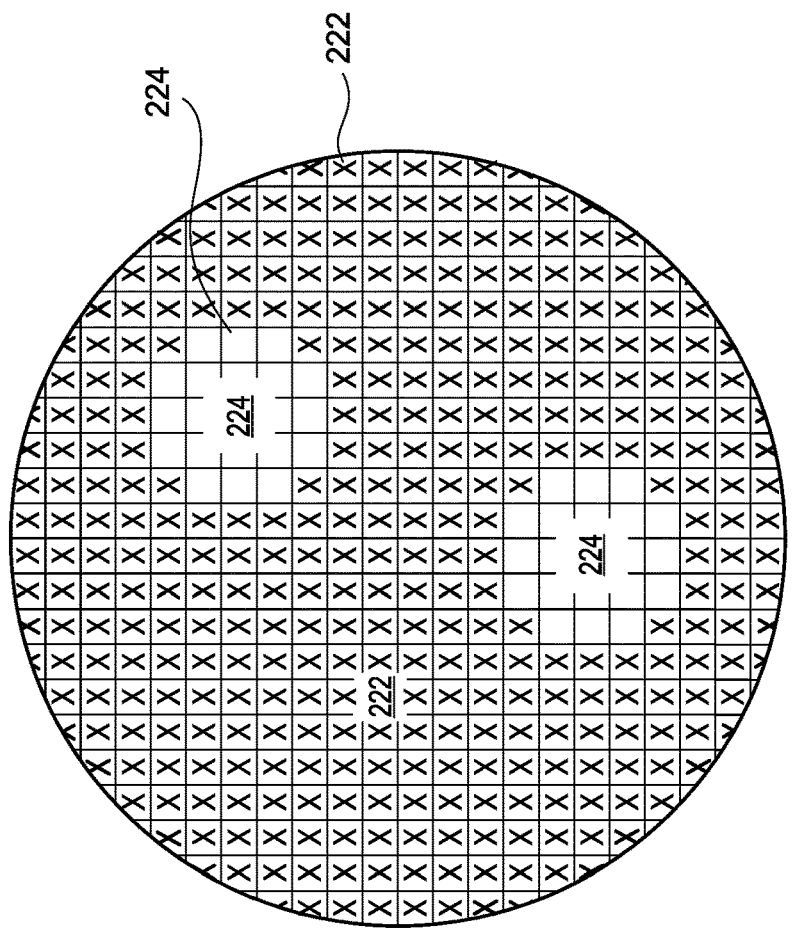
FIG. 2C is a close-up view of a portion of the digital image shown in FIG. 2B.
Figure 2B:
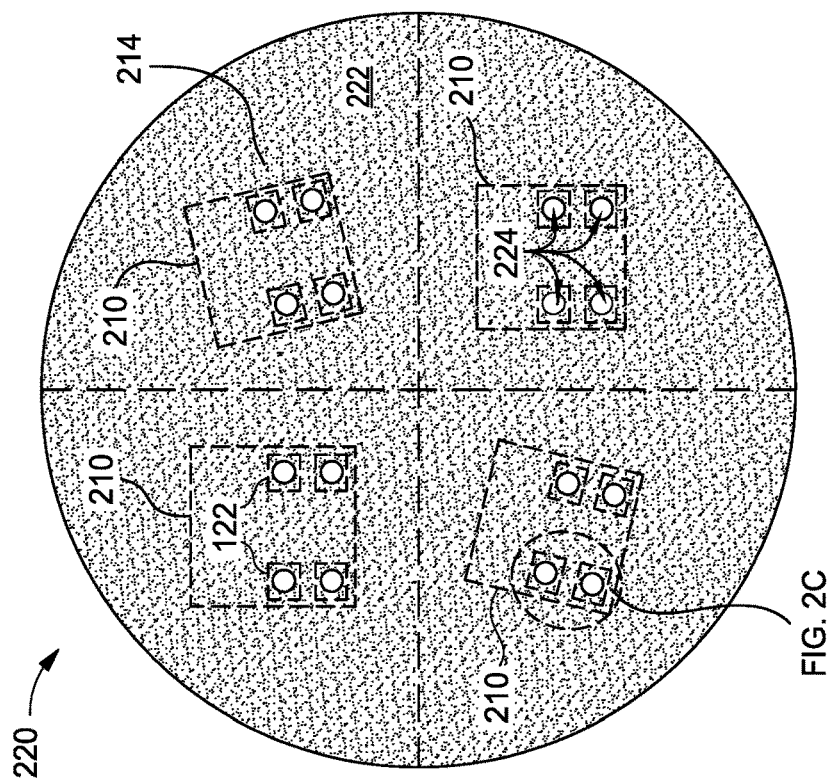
FIG. 2B illustrate printing instructions, herein a digital image, for a patterned sublayer of a to be formed patterned dielectric layer on the carrier substrate described in FIG. 2A, according to one embodiment.

FIG. 2B illustrates printing instructions used to form the patterned dielectric layers described herein, according to one embodiment. FIG. 2C is a close-up view of a portion of the digital image shown in FIG. 2B. Typically, the patterned dielectric layers described herein are formed by the sequential deposition and at least partial curing of a plurality of patterned sublayers. Each of the patterned sublayers are formed according to a set of printing instructions comprising desired patterns for each of the plurality of patterned sublayers. Herein, a desired pattern 220 is a bitmap image used by a system controller of an additive manufacturing system to control the dispensing and at least partial curing of a plurality of droplets of one or more dielectric precursor compositions at selected locations on the exemplary carrier substrate 120 described in FIG. 2A. The desired pattern 220 includes a pixelated region 222 and a plurality of non-pixelated regions 224 bounded by the pixelated region 222. The pixelated region 222 comprises a plurality of pixels X, shown in FIG. 2C, where each pixel X corresponds to a desired dispense location of a droplet of dielectric precursor composition and the non-pixelated regions 224 correspond to desired locations of interconnect openings in the to be formed patterned sublayer.

Herein, the desired pattern 220 is generated by the system controller based on the actual positions 210 of each of the plurality of singulated devices 121 in the carrier substrate 120 and the desired locations of interconnect openings in a to be formed thereabove patterned sublayer. The desired pattern 220 is generated using any method suitable for aligning one or more interconnect openings of the to be formed patterned sublayer with the actual positions 210 of each of the plurality of singulated devices 121, i.e., with the actual positions the bond pads 122 of each of the plurality of singulated devices 121.

Figure 3:
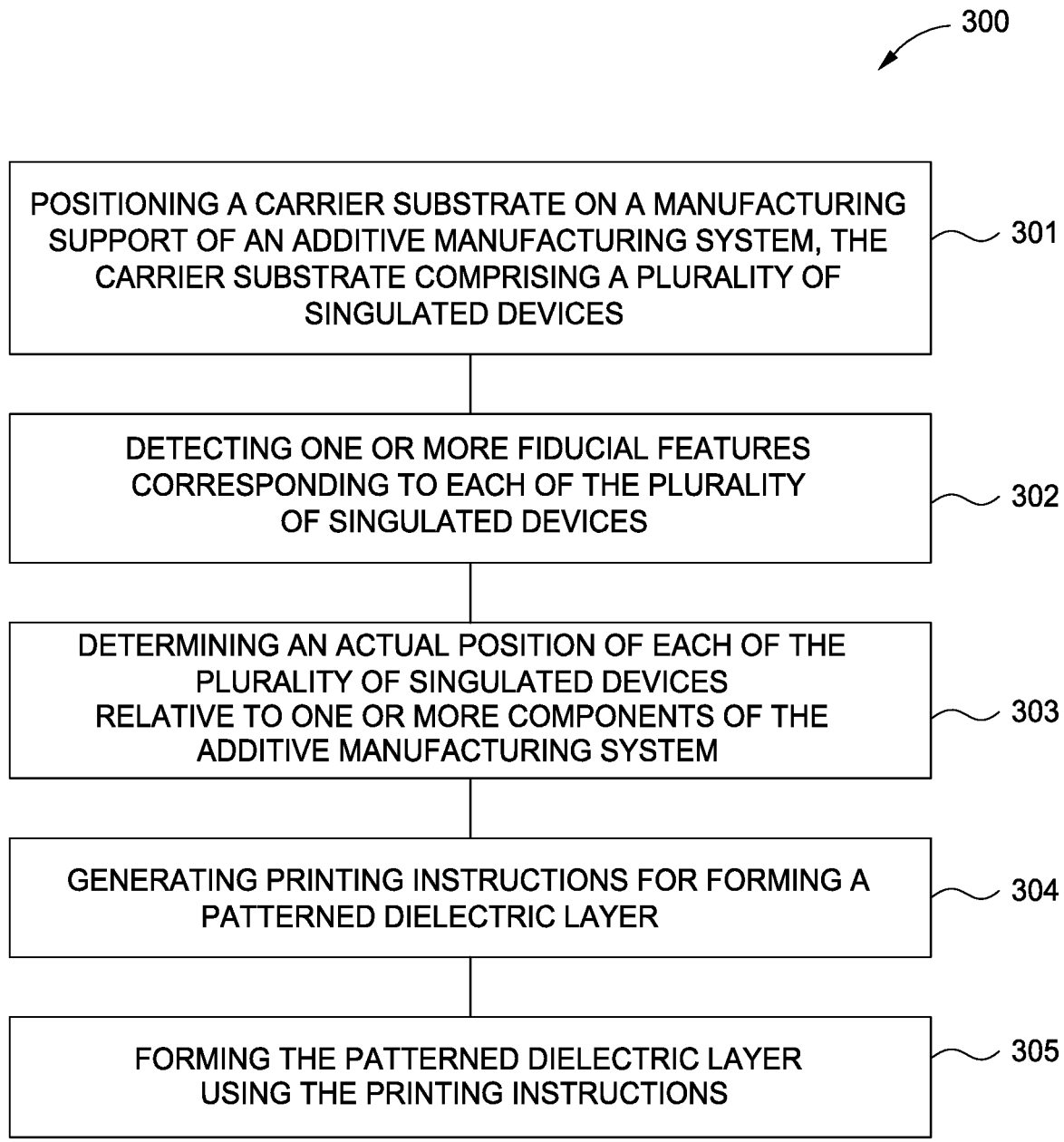
FIG. 3 is a flow diagram of a method of forming a bond pad redistribution layer, according to one embodiment.

FIG. 3 is a flow diagram of a method of forming a bond pad RDL, according to one embodiment. At activity 301 the method 300 includes positioning a carrier substrate on a manufacturing support of an additive manufacturing system. In some embodiments, the carrier substrate is a reconstituted substrate and includes a plurality of singulated devices embedded in, and spaced apart by, a molding compound, such as an epoxy. Herein, the carrier substrate has a first surface which includes active surfaces of the plurality of singulated devices and a second surface opposite of the first surface. The carrier substrate is typically positioned on the manufacturing support in a face up position where the second surface is proximate to and in contact therewith. In some embodiments, the carrier substrate includes a plurality of through vias disposed in the molding compound between each of the plurality of singulated devices, such as through vias used in a through integrated fan-out via (TIV) packaging scheme. In other embodiments, the carrier substrate is a rigid or semi-rigid plate having a plurality of singulated devices temporarily secured thereto. In those embodiments, the method may further include forming a reconstituted substrate by dispensing and curing one or more precursor compositions about the plurality of singulated devices using embodiments described herein.

At activity 302 the method 300 includes detecting one or more fiducial features corresponding to each of the plurality of singulated devices. In some embodiments, the one or more fiducial features include dedicated alignment marks or patterns of device features, for example metal interconnects, formed in active surface of the device or below the active surface of the singulated device and detectable through one or more optically transparent layers thereof. In some embodiments, the one or more fiducial features include one or more physical edges or a physical perimeter of the singulated device at interfaces between the edges or physical perimeter of the singulated device and the molding compound. In other embodiments, such as where the carrier substrate has a previously formed bond pad RDL disposed thereon, the one or more fiducial features include one or more of dedicated alignment marks or a pattern of interconnect features, such as metal via or wire interconnects, formed in a surface of the previously formed bond pad RDL.

In some embodiments, detecting one or more fiducial features of each of the plurality of singulated devices includes using an image sensor to capture an image of the singulated device, or information that can be used to form an image of the singulated device. For example, in some embodiments, detecting one or more fiducial features includes detecting one or more interfaces of features in or of each of the devices or in or of a redistribution layer formed thereon. Typically, the method 300 further includes communicating the detected image, a portion of the detected image, or information that can be used to form an image, to a system controller of the additive manufacturing system. Herein, information that can be used to form an image includes positional information of the device or one or more features of the device whether or not an image is subsequently formed from the positional information.

At activity 303 the method 300 includes determining an actual position of each of the plurality of singulated devices relative to one or more components of the additive manufacturing system. Typically, determining the actual position of each of the plurality of singulated devices includes comparing one or more fiducial features of each of the devices to a reference image or reference information that can be used to form a reference image whether or not an image is formed from the reference information. In some embodiments, the reference image is of an exemplary device or a portion of an exemplary device. In some embodiments, the reference image is of an exemplary dedicated alignment mark. Typically, the reference image or reference information is stored in the memory of the system controller.

At activity 304 the method 300 includes generating printing instructions to be used in forming a patterned dielectric layer. Herein, the printing instructions are in any form suitable for controlling the dispensing of droplets of one or more dielectric precursor compositions at desired locations on the carrier substrate or on a bond pad RDL formed on the carrier substrate. For example, in some embodiments, the printing instructions are in the form of one or a combination of vector information, other positional information or a digital image, such as a bitmap image or a pixel map, used to direct the dispensing of droplets of a dielectric precursor composition from one or more dispense nozzles. In some embodiments, the printing instructions further include curing instructions to control the exposure, including the timing and duration of exposure, of the dispensed dielectric precursor composition to electromagnetic radiation from a curing source. In some embodiments, the printing instructions further include instructions to control the volume of the droplets dispensed from the one or more dispense nozzles which allows for fine control of the thickness of each of the patterned sublayers. Typically, the printing instructions provide for the sequential deposition and at least partial curing of a plurality of patterned sublayers which together form the patterned dielectric layer.

In some embodiments, generating the printing instruction includes aligning desired interconnect openings in the to be formed patterned dielectric layer with the actual positions of the singulated devices in the carrier substrate. In some embodiments, generating the printing instructions includes comparing the actual positions of each of the plurality of singulated devices to an instruction template and overlaying the instruction template on the actual positions of each of the plurality of singulated devices.

Figure 4:
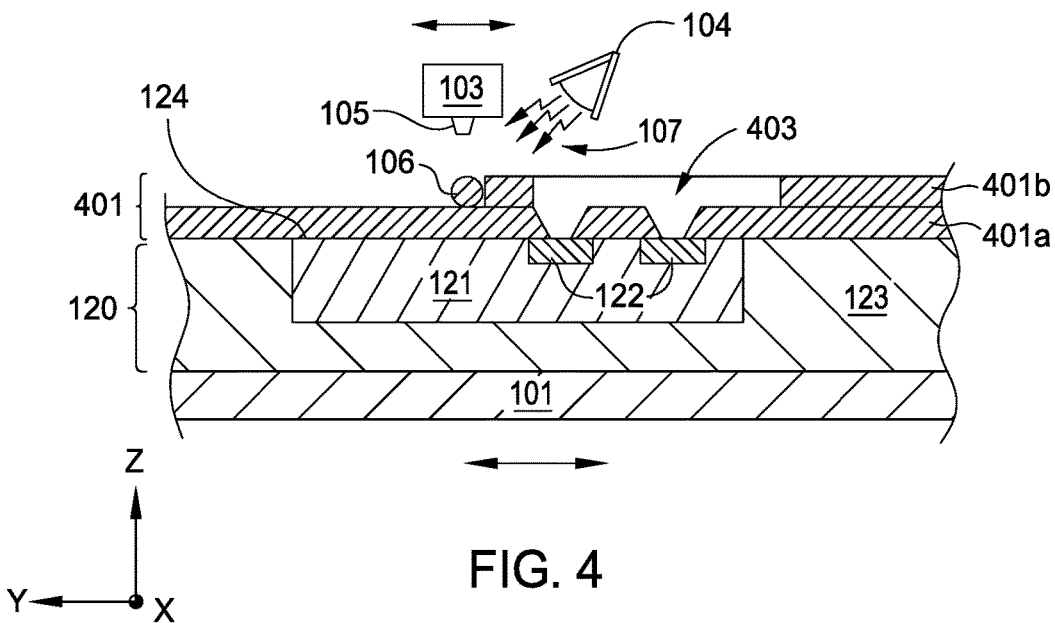
FIG. 4 illustrates the formation of a patterned dielectric layer on carrier substrate, according to one embodiment.

At activity 305 the method 300 includes forming the patterned dielectric layer using the printing instructions. FIG. 4 illustrates the formation of a patterned dielectric layer on a carrier substrate, according to one embodiment. Herein, forming a patterned dielectric layer 401 includes the sequential formation of a plurality of patterned sublayers, such as the first and second patterned sublayers 401*a-b* where each of the patterned sublayers is formed of a polymerized dielectric precursor composition and includes a plurality of interconnect openings 403 disposed therethrough. Forming each of the patterned sublayers 401a-b includes depositing and at least partially curing a plurality of droplets 106 of one or more dielectric precursor compositions using the printing instructions generated at activity 304. In some embodiments, each of the droplets 106 dispensed about the desired perimeter of a desired interconnect opening, such as interconnect opening 403, is fixed by the at least partial curing thereof before the droplet 106 spreads to its equilibrium size. Fixing the dispensed droplets 106 about the perimeter of a desired interconnect opening 403 facilitates the formation of vertical or substantially vertical sidewalls, e.g., within 45° of vertical, of the interconnect opening 403 and prevents dispensed droplets from undesirably flowing thereinto. In some embodiments, the patterned dielectric layer further includes a plurality of dedicated alignment mark openings (not shown) each corresponding to the actual position of a singulated device disposed therebelow or proximate thereto.

Typically, the dielectric precursor composition comprises a mixture of one or more functional polymers, functional oligomers, functional monomers, and/or reactive diluents that are at least monofunctional and undergo polymerization when exposed to free radicals; photoacids, Lewis acids, and/or electromagnetic radiation.

Examples of functional polymers herein include multifunctional acrylates including di, tri, tetra, and higher functionality acrylates, such as 1,3,5-triacryloylhexahydro-1,3,5-triazine or trimethylolpropane triacrylate.

Examples of functional oligomers include monofunctional and multifunctional oligomers, acrylate oligomers, such as aliphatic urethane acrylate oligomers, aliphatic hexafunctional urethane acrylate oligomers, diacrylate, aliphatic hexafunctional acrylate oligomers, multifunctional urethane acrylate oligomers, aliphatic urethane diacrylate oligomers, aliphatic urethane acrylate oligomers, aliphatic polyester urethane diacrylate blends with aliphatic diacrylate oligomers, or combinations thereof, for example bisphenol-A ethoxylate diacrylate or polybutadiene diacrylate. In one embodiment, the functional oligomer comprises tetrafunctional acrylated polyester oligomer available from Allnex Corp. of Alpharetta, Ga. as EB40® and the functional oligomer comprises an aliphatic polyester based urethane diacrylate oligomer available from Sartomer USA of Exton, Pa. as CN991.

Examples of monomers used in the dielectric precursor composition include tetrahydrofurfuryl acrylate (e.g. SR285 from Sartomer®), tetrahydrofurfuryl methacrylate, vinyl caprolactam, isobornyl acrylate, isobornyl methacrylate, 2-phenoxyethyl acrylate, 2-phenoxyethyl methacrylate, 2-(2-ethoxyethoxy)ethyl acrylate, isooctyl acrylate, isodecyl acrylate, isodecyl methacrylate, lauryl acrylate, lauryl methacrylate, stearyl acrylate, stearyl methacrylate, cyclic trimethylolpropane formal acrylate, 2-[[(Butylamino) carbonyl]oxy]ethyl acrylate (e.g. Genomer 1122 from RAHN USA Corporation), 3,3,5-trimethylcyclohexane acrylate, or mono-functional methoxylated PEG (350) acrylate. Multifunctional monomers include diacrylates or dimethacrylates of diols and polyether diols, such as propoxylated neopentyl glycol diacrylate, 1,6-hexanediol diacrylate, 1,6-hexanediol dimethacrylate, 1,3-butylene glycol diacrylate, 1,3-butylene glycol dimethacrylate 1,4-butanediol diacrylate, 1,4-butanediol dimethacrylate, alkoxylated aliphatic diacrylate (e.g., SR9209A from Sartomer®), diethylene glycol diacrylate, diethylene glycol dimethacrylate, dipropylene glycol diacrylate, tripropylene glycol diacrylate, triethylene glycol dimethacrylate, alkoxylated hexanediol diacrylates, or combinations thereof, for example SR562, SR563, SR564 from Sartomer®.

Examples of reactive diluents used in the dielectric precursor composition include monoacrylate, 2-ethylhexyl acrylate, octyldecyl acrylate, cyclic trimethylolpropane formal acrylate, caprolactone acrylate, isobornyl acrylate (IBOA), or alkoxylated lauryl methacrylate.

Examples of photoacids used in the dielectric precursor composition include onium salts such as Omnicat 250, Omnicat 440, and Omnicat 550, manufactured by manufactured by IGM Resins USA Inc. of Charlotte N.C. and compositional equivalents thereof, triphenylsulfonium triflate, and triarylsulfonium salt type photo acid generators such as CPI-210S available from San-Apro Ltd. of Tokyo, Japan, and compositional equivalents thereof.

In some embodiments, the dielectric precursor composition further comprises one or more photoinitiators. Photoinitiators used herein include one or both of polymeric photoinitiators and oligomer photoinitiators, such as benzoin ethers, benzyl ketals, acetyl phenones, alkyl phenones, phosphine oxides, benzophenone compounds and thioxanthone compounds that include an amine synergist, combinations thereof, and equivalents thereof. For example, in some embodiments photoinitiators include Irgacure® products manufactured by BASF of Ludwigshafen, Germany, or equivalent compositions.

Typically, the dielectric precursor composition is formulated to have a viscosity between about 80 cP and about 110 cP at about 25° C., between about 12 cP and about 30 cP at about 70° C., or between 10 cP and about 40 cP for temperatures between about 50° C. and about 150° C. so that the dielectric precursor compositions may be effectively dispensed through the nozzles of the one or more dispense heads.

Figure 5:
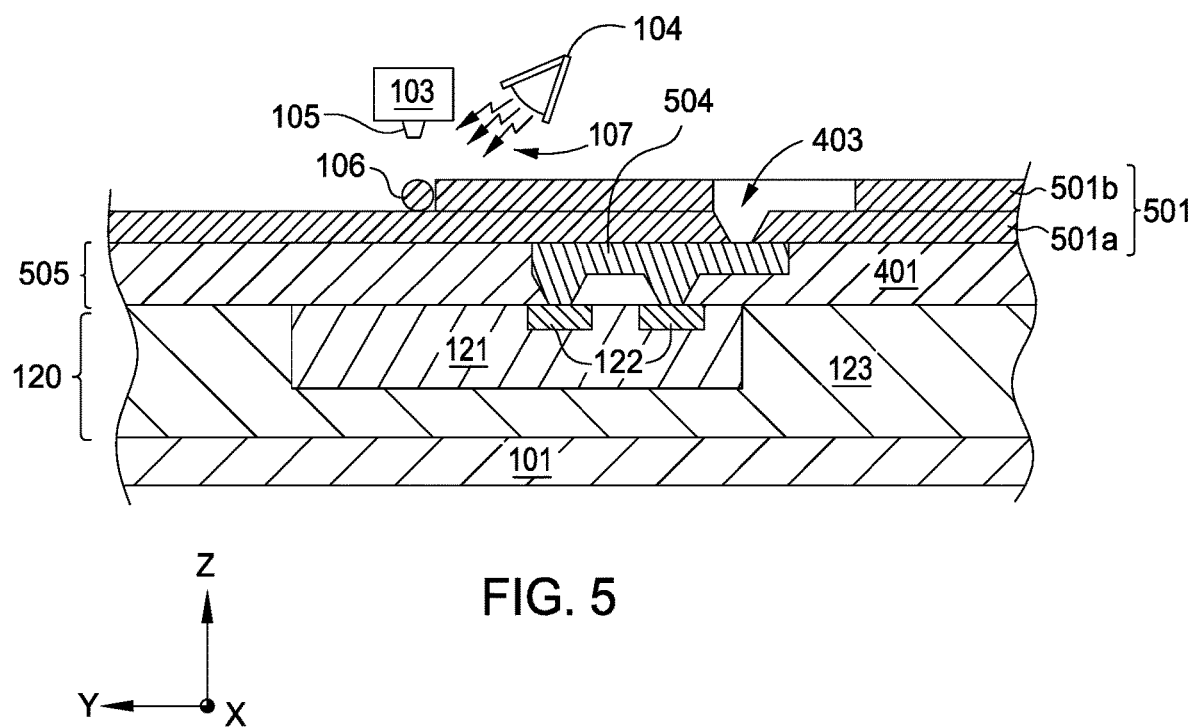
FIG. 5 illustrates the formation of a patterned dielectric layer on a previously formed bond pad, according to one embodiment.

FIG. 5 illustrates the formation of a patterned dielectric layer on a previously formed bond pad RDL, according to one embodiment. Herein, the previously formed bond pad RDL 505 includes a plurality of conductive features 504 disposed in the patterned dielectric layer 401, which form a detectable pattern in the surface of the previously formed bond pad RDL 505. In some embodiments, the previously formed bond pad RDL 505 further includes a plurality of dedicated alignment marks (not shown) disposed in the surface thereof, where each of the plurality of dedicated alignment marks correspond to a singulated device disposed below the previously formed bond pad RDL 505 and are proximate thereto. In some embodiments, one or both of the plurality of conductive features 504 or the dedicated alignment mark are used as fiducial features by the additive manufacturing system to determine the actual position, including the orientation, of a singulated device corresponding thereto.

In some embodiments, the method further includes dispensing, using the additive manufacturing system, a conductive precursor, such as a conductive ink, into the plurality of interconnect openings to form the interconnects of a bond pad RDL, such as the bond pad RDL 505 shown in FIG. 5. In other embodiments, via and wire interconnects are formed by a conventional deposition and planarization process sequence.

Embodiments provided herein beneficially eliminate costly and time consuming lithography and etch processes conventionally used to form bond pad RDLs in FOWLP schemes. Further, embodiments provided herein allow for alignment of RDL via and wire interconnects with the actual positions of singulated devices on a carrier substrate which reduces or eliminates alignment errors associated with conventional RDL formation methods.

While the foregoing is directed to embodiments of the present disclosure, other and further embodiments of the disclosure may be devised without departing from the basic scope thereof, and the scope thereof is determined by the claims that follow.

The invention claimed is:

1. A method of forming a redistribution layer, comprising:
    positioning a carrier substrate on a manufacturing support of an additive manufacturing system, the carrier substrate including a plurality of singulated devices;
    detecting one or more fiducial features corresponding to each of the plurality of singulated devices;
    determining actual positions of each of the plurality of singulated devices relative to one or more components of the additive manufacturing system;
    generating printing instructions for forming a patterned dielectric layer based on the actual positions of each of the plurality of singulated devices; and
    forming the patterned dielectric layer using the printing instructions.

2. The method of claim 1, wherein the carrier substrate comprises a molding compound, and wherein the plurality of singulated devices are embedded in, and spaced from one another, by the molding compound.

3. The method of claim 1, wherein the one or more fiducial features corresponding to each of the plurality of singulated devices include dedicated alignment marks, patterns of features in or below active surfaces of the singulated devices, physical edges of the singulated devices, perimeters of the singulated devices, or combinations thereof.

4. The method of claim 1, wherein the one or more fiducial features corresponding to each of the plurality of singulated devices include dedicated alignment marks or patterns formed in a bond pad redistribution layer disposed on the carrier substrate.

5. The method of claim 1, wherein the additive manufacturing system further includes one or more image sensors used to detect the one or more fiducial features.

6. The method of claim 5, wherein at least one of the one or more image sensors is a camera, a laser scanner, an interferometer, or a combination thereof.

7. The method of claim 1, wherein determining the actual positions of each of the plurality of singulated devices includes comparing one or more fiducial features of each of the singulated devices to a reference image or reference information of an exemplary device.

8. The method of claim 1, wherein forming the patterned dielectric layer comprises sequentially forming a plurality of patterned sublayers, wherein each of the plurality of patterned sublayers have a plurality of openings disposed therethrough.

9. The method of claim 8, wherein forming each of the plurality of patterned sublayers comprises depositing and at least partially curing a plurality of droplets of a dielectric precursor composition according to the printing instructions.

10. The method of claim 8, wherein forming the plurality of openings comprises dispensing and at least partially curing a plurality of droplets of a dielectric precursor composition about desired perimeters of the plurality of openings.

11. The method of claim 10, wherein each of the plurality of droplets are fixed by the at least partial curing thereof before the droplet spreads to its equilibrium size.

12. The method of claim 11, wherein a contact angle of each of the droplets is fixed at an angle of greater than about 50°.

13. The method of claim 10, further comprising forming one or more interconnects by dispensing, using the additive manufacturing system, a conductive precursor into the one or more of the plurality of openings.

14. A method of forming a redistribution layer, comprising:
    positioning a carrier substrate on a manufacturing support of an additive manufacturing system, the carrier substrate comprising a plurality of singulated devices embedded in and spaced apart by a molding compound;
    detecting one or more fiducial features corresponding to each of the plurality of singulated devices using one or more image sensors of the additive manufacturing system;
    determining actual positions of each of the plurality of singulated devices relative to one or more components of the additive manufacturing system;
    generating printing instructions for forming a patterned dielectric layer based on the actual positions of each of the plurality of singulated devices; and
    forming the patterned dielectric layer using the printing instructions comprising dispensing, using the additive manufacturing system, a plurality of droplets of dielectric precursor composition about perimeters of a plurality of desired openings in the to be formed patterned dielectric layer and at least partially curing each of the plurality of dispensed droplets before it spreads to its equilibrium size.

15. The method of claim 14, wherein the one or more fiducial features corresponding to each of the plurality of singulated devices include dedicated alignment marks, patterns of features in or below active surfaces of the singulated devices, physical edges of the singulated devices, perimeters of the singulated devices, or combinations thereof.

16. The method of claim 14, wherein the one or more fiducial features corresponding to each of the plurality of singulated devices include dedicated alignment marks or patterns formed in a bond pad redistribution layer disposed on the carrier substrate.

17. The method of claim 14, wherein at least one of the one or more image sensors is a camera, a laser scanner, an interferometer, or a combination thereof.

18. The method of claim 17, wherein a contact angle of each of the plurality of dispensed droplets is fixed at an angle of greater than about 50°.

19. The method of claim 18, further comprising forming a plurality of interconnects by dispensing, using the additive manufacturing system, a conductive precursor into the plurality of openings.

20. A computer readable medium having instructions stored thereon for a method of forming a redistribution layer, the method comprising:
    positioning a carrier substrate on a manufacturing support of an additive manufacturing system, the carrier substrate comprising a plurality of singulated devices embedded in and spaced apart by a molding compound;
    detecting one or more fiducial features corresponding to each of the plurality of singulated devices using one or more image sensors of the additive manufacturing system;
    determining actual positions of each of the plurality of singulated devices relative to one or more components of the additive manufacturing system;

generating printing instructions for forming a patterned dielectric layer based on the actual positions of each of the plurality of singulated devices; and forming the patterned dielectric layer using the printing instructions comprising dispensing, using the additive manufacturing system, a plurality of droplets of dielectric precursor composition about a perimeter of a plurality of desired openings in the to be formed patterned dielectric layer and at least partially curing each of the plurality of dispensed droplets before it spreads to its equilibrium size.

* * * * *